(12) United States Patent
Fukaishi et al.

(10) Patent No.: US 7,366,821 B2
(45) Date of Patent: Apr. 29, 2008

(54) HIGH-SPEED MEMORY SYSTEM

(75) Inventors: Muneo Fukaishi, Tokyo (JP); Masato Motomura, Tokyo (JP); Yoshiharu Aimoto, Tokyo (JP); Masakazu Yamashina, Tokyo (JP)

(73) Assignee: NEC Corporation, Tokyo (JP)

( * ) Notice: Subject to any disclaimer, the term of this patent is extended or adjusted under 35 U.S.C. 154(b) by 540 days.

(21) Appl. No.: 10/311,687

(22) PCT Filed: Jun. 20, 2001

(86) PCT No.: PCT/JP01/05270

§ 371 (c)(1),
(2), (4) Date: Mar. 18, 2003

(87) PCT Pub. No.: WO01/98880

PCT Pub. Date: Dec. 27, 2001

(65) Prior Publication Data

US 2003/0163606 A1  Aug. 28, 2003

(30) Foreign Application Priority Data

Jun. 21, 2000  (JP)  ............................. 2000-186234

(51) Int. Cl.
*G06F 12/00* (2006.01)
*G06F 9/00* (2006.01)

(52) U.S. Cl. ............................ 711/5; 711/154; 711/104; 711/105; 365/230.03; 365/189.05; 365/83; 365/51

(58) Field of Classification Search ................ 711/5, 711/104, 105, 154; 365/83, 230.03, 189.05, 365/51
See application file for complete search history.

(56) References Cited

U.S. PATENT DOCUMENTS

| 3,593,167 | A | * | 7/1971 | Koulopoulos | ............... 327/156 |
| 4,930,066 | A | * | 5/1990 | Yokota | ....................... 711/149 |
| 5,893,919 | A | * | 4/1999 | Sarkozy et al. | ............. 711/114 |
| 6,011,710 | A | * | 1/2000 | Wiggers | ....................... 365/63 |
| 6,349,051 | B1 | * | 2/2002 | Klein | ........................... 365/63 |
| 6,502,161 | B1 | * | 12/2002 | Perego et al. | .................. 711/5 |

(Continued)

FOREIGN PATENT DOCUMENTS

JP  1-296327 A  11/1989

(Continued)

OTHER PUBLICATIONS

Hiroshige Gotō, Hiroshige Gotō's Weekly Foreign News, This is the Heart of the Play Station 2 Emotion Engine, Mar. 2, 2000, PC Watch, retrieved on Sep. 13, 2004), Internet,<URL:http://pc.watch. impress co.jp/docs/articles/20000302/kaigai01.htm.

Norihiko Tadano, Direct Rambus, "1999nen no Pasokon nushi Kioku wo nerau (vol. 2) Protocol ya Denryoku Seigyo Kinou wo Saiteki-ka", Nikkei Electronics, Feb. 23, 1998, No. 710, pp. 163-176.

*Primary Examiner*—Kimberly McLean
(74) *Attorney, Agent, or Firm*—Sughrue Mion, PLLC

(57) ABSTRACT

A memory system has a memory controller and a plurality of memories. The plurality of memories are connected via a switch to an end of a bus, which is connected to the memory controller, wherein the plurality of memories are controlled by the switch. By suppressing reflection and loads on the bus, a higher data transmission speed can be obtained.

9 Claims, 21 Drawing Sheets

U.S. PATENT DOCUMENTS

| | | | |
|---|---|---|---|
| 6,530,033 B1 * | 3/2003 | Raynham et al. | 714/5 |
| 6,628,605 B1 * | 9/2003 | Chang | 370/208 |
| 6,708,248 B1 * | 3/2004 | Garrett et al. | 711/104 |
| 6,742,098 B1 * | 5/2004 | Halbert et al. | 711/172 |
| 6,856,554 B2 * | 2/2005 | Korotkov et al. | 365/189.05 |
| 6,903,954 B2 * | 6/2005 | Klein | 365/63 |
| 6,954,281 B2 * | 10/2005 | Fukuda et al. | 358/1.16 |
| 7,007,130 B1 * | 2/2006 | Holman | 711/5 |
| 2001/0039601 A1 * | 11/2001 | Leung et al. | 711/101 |
| 2003/0043683 A1 * | 3/2003 | Funaba et al. | 365/230.03 |
| 2004/0064646 A1 * | 4/2004 | Emerson et al. | 711/131 |
| 2004/0084537 A1 * | 5/2004 | Best | 235/492 |

FOREIGN PATENT DOCUMENTS

| | | |
|---|---|---|
| JP | H01-296327 A | 11/1989 |
| JP | 2-15356 A | 1/1990 |
| JP | H2-15356 | 1/1990 |
| JP | H02-15356 A | 1/1990 |
| JP | 8-6849 A | 1/1996 |
| JP | 10-55668 A | 2/1998 |
| JP | 10-124210 A | 5/1998 |
| JP | 10-228449 A | 8/1998 |
| JP | H10-228449 | 8/1998 |
| JP | H10-228449 A | 8/1998 |
| JP | H11-7335 A | 1/1999 |
| JP | 2000-57051 | 2/2000 |
| JP | 2000-57051 A | 2/2000 |
| JP | 2001-156621 | 6/2001 |
| JP | 2002-525737 | 8/2002 |
| JP | 2002-525737 A | 8/2002 |
| WO | WO 99/46685 | 9/1999 |
| WO | WO 99/46685 A1 | 9/1999 |

* cited by examiner

HIGH-SPEED MEMORY SYSTEM

FIELD OF THE INVENTION

The present invention relates to a high-speed memory system and, more particularly, to a memory system having a higher transmission speed and a higher operational speed, and also relates to a memory interface used in such a memory system and a memory chip.

BACKGROUND OF THE INVENTION

FIG. 18 shows a conventional memory system. In the drawing, a bus 1802 connected to a memory controller 1801 extends in one direction, and a plurality of memory modules 1804 each mounting thereon a plurality of (two in the drawing) memory chips 1803 are connected in parallel with each other to the bus 1802. In this text, such a connection structure for the bus, i.e., memory interface is referred to as a bus-connection-type interface in a memory device, typically represented by a synchronous DRAM (SDRAM) or a rambus DRAM (RDRAM).

Since the bus-connection-type interface connects a plurality of memory chips or memory modules in parallel with each other to the extending bus, it has a remarkable advantage in connection with the extendibility (increase of the number) of the memories.

However, due to the configuration wherein a plurality of memory chips or a memory modules are connected to the extending bus at respective locations thereof, there arises the problems of a high-level reflection on the transmission line, and a large number of loads (fan-outs) disposed on the transmission line, thereby making it difficult to increase the transmission speed on the bus. It is considered that the transmission speed thereon is limited to around 1 to 2 Gb/s, for example.

In addition, since the memory chips or the memory modules are connected to the extending bus at respective locations, there arise a case wherein the data skew caused by a difference in the length of the transmission line is not negligible. More specifically, the phases of the data input to the memory are different data by data, which prevents the data which should be input simultaneously from being fetched simultaneously, thereby causing a malfunction. This problem appears more significantly along with a higher-speed transmission of the data.

FIG. 19 is a block diagram showing the conventional memory chip. An 8-bit command/address packet, for example, serially fed from the bus is converted into parallel data by a 1:8 demultiplexer (serial-parallel converter circuit), decoded by a packet decoder circuit (decoder) 1902, certified for ID thereof by an ID certification circuit 1903, and then input to a memory core 1904 wherein memory cells are arranged in a matrix.

On the other hand, input data including 8-bit serial data are converted by another 1:8 demultiplexer 1905 into parallel 64-bit data, which are input to the memory core 1904. The output 64-bit data from the memory core 1904 is serially converted by an 8:1 multiplexer 1906, and fed as an 8-bit serial data.

FIG. 20 is a block diagram showing the fetch of the input data in the conventional memory chip, wherein the input data among the conventional input/output data shown in FIG. 19 and the 1:8 demultiplexer are detailed.

If the data width of the input data is 8 bits, for example, then the input data 2001 are fed from a 8-bit bus, and each of data 2001A to 2001H are input to a corresponding one of eight 1:8 demultiplexers 2002A to 2002H. These 8-bit input data 2001A to 2001H are fetched by the 1:8 demultiplexers 2002A to 2002H, respectively, at a single input clock 2004.

A data fetch operation by the conventional memory chip will be described with reference to the timing chart of FIG. 21. The clock 2004 allows the data 2001A to 2001H to be fetched at the same timing, which is substantially the center (shown by dotted line) between a transition of data 2001 to 2001H and another transition thereof.

It is to be noted that the 8-bit input data 2001A to 2001H have some phase deviations therebetween due to a difference in the length of the transmission line along which each data is transferred. These phase deviations are referred to as data skews 2010. If the data skews 2010 are negligibly small compared to the data rate, then the fetch of the 8-bit data at the single clock 2004 can be performed normally.

However, if the data skews are not negligible, i.e., if the transmission speed of the data is higher and does not allow the data skews to be negligible with respect to the data rate, then all the 8-bit data cannot be fetched at the same timing by using a single clock. Thus, one of the limits on the transmission speed of the transmitted data in the conventional memory chip is that a plurality of data having data skews therebetween due to the difference in the length of the transmission line cannot be fetched in the memory chip at the same timing, as described above.

In summary, the first problem in the conventional technique is that since the memory chips or memory modules are connected to the extending bus at the respective locations thereof, a large reflection arises on the transmission line and the loads (fan-out number) on the transmission line increases, whereby it is difficult to raise the transmission speed on the bus.

The second problem in the conventional technique is that since the memory chips or memory modules are connected to the extending bus at the respective locations thereof, the data skews due to the difference in the length of the transmission line is not negligible.

The third problem in the conventional technique is that since there is no effective countermeasure employed against the data skews, there is a possibility that a malfunction may arise.

SUMMARY OF THE INVENTION

In view of the above, it is an object of the present invention to provide a memory system and a memory interface which are capable of realizing a high-speed signal transmission by suppressing the reflection and loads on the transmission line.

It is another object of the present invention to provide a memory system and a memory interface which are capable of suppressing the data skews caused by a difference in the length of the transmission line.

It is a further object of the present invention to provide a memory chip having an effective countermeasure employed against the data skews.

It is a further object of the present invention to provide a memory system using the memory chip having the effective countermeasure employed against the data skews and having a higher transmission speed.

The present invention provides, in a first aspect thereof, a memory system including a memory controller and a plurality of memories wherein the plurality of memories are connected to a bus at a specified position thereof via a switch, the bus being connected to the memory controller, and wherein the switch controls the operation of the plurality of memories.

In a preferred embodiment, a plurality of the switches are arranged in a hierarchical order. In addition, the switch is preferably star-connection-type switch, multiplexer-type (parallel-serial conversion) switch or demultiplexer-type (serial-parallel conversion) switch.

A data recovery circuit is preferably provided to the switch. The data recovery circuit may be preferably provided to the memory controller or the memory as well.

The plurality of memories may be formed as respective memory chips, and the switch may be formed as an independent switch chip. In this case, the memory chips and the switch chip are preferably mounted on a single memory module. In addition, a plurality of the memory modules may be connected via the respective buses to the memory controller.

The present invention provides, in a second aspect thereof, a memory system including a memory controller and a plurality of memories, wherein the plurality of memories are connected to the memory controller via respective buses. The memory controller or the memories may be provided with data recovery circuits.

The present invention provides, in a third aspect thereof, a memory interface including a data recovery circuit provided in a memory controller and connected to a bus, and a switch for connecting the plurality of memories to a specified position of the bus. The switch may be provided with a data recovery circuit.

The present invention provides, in a fourth aspect thereof, a memory chip wherein a command/address signal and a data signal are input to a memory core including therein a plurality of memory cells arranged in a matrix, and wherein each of the command/address signal and the data signal is input to the memory core via a data recovery circuit. Each of the command/address signal and the data signal may be input to the memory core via a data synchronizer circuit and a packet decoder circuit after passing through the data recovery circuit. In addition, a demultiplexer (serial-parallel conversion) circuit may be provided between the data recovery circuit and the data synchronizer circuit.

In accordance with the present invention, even if the number of memories is increased, since the respective memories are connected to the memory controller in one-to-one connection, reflection on the transmission line as well as the loads (fan-out number) does not increase, whereby a higher transmission speed can be achieved on the bus.

In addition, by using the configuration wherein the circuits including the data recovery circuit and the data synchronizer circuit are provided on the input sides of the memory chips, the switch or memory controller, the phases of the input signals having phase differences therebetween can be aligned, whereby a malfunction caused by the data skews can be suppressed to achieve a higher speed operation.

PREFERRED EMBODIMENTS OF THE INVENTION

Figure 1:
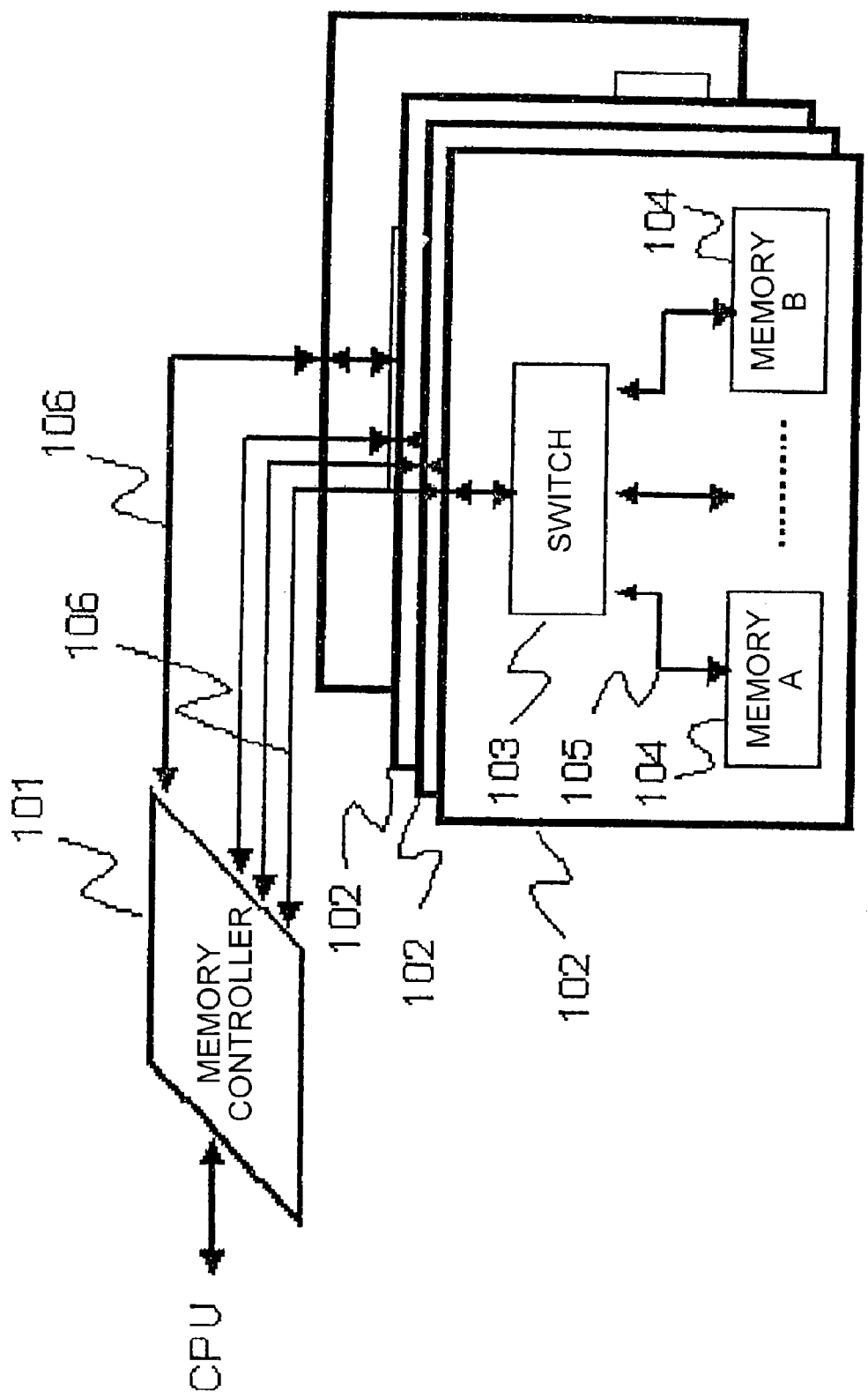
FIG. 1 is a schematic perspective view of a memory system according to an embodiment of the present invention.

The present invention will be described hereinafter with reference to the drawings. Referring to FIG. 1, a memory system according to an embodiment of the present invention includes a memory controller 101, and a plurality of memories 104, wherein the plurality of memories 104 are connected via a switch 103 and respective interconnect lines 105 to a specified position, i.e., an end, of a corresponding bus 106, which is connected to the memory controller 101.

The operation of the plurality of memories 104, including memory A and memory B, are controlled by the switch 103. The plurality of memories 104 are formed as respective memory chips 104, whereas the switch 103 is formed on an independent switch chip 103. These chips are mounted on the same memory module 102. In the present embodiment, a plurality of memory modules 102 are connected to the memory controller 101 via respective buses 106, whereby a large number of memories are connected thereto.

Each bus 106 includes a group of interconnect lines such as including data signal lines and control signal lines. The number of signal lines is n if n-bit data is transmitted in parallel, whereas the number of signal lines is one if n-bit data is transmitted in series. Although the case of a serial transmission is exemplified in the description of the present embodiment, the configuration and advantages of the present invention are similar in a parallel transmission as well.

As shown in FIG. 1, since the operation of the plurality of memories including memory A and memory B is controlled by the switch, the memories are connected to the memory controller 101 in one-to-one connection even if the memory B is added to the memory A.

Accordingly, even if the number of memories is to be increased, the reflection on the transmission line as well as the number of loads (fan-outs) does not increase, whereby a higher transmission speed can be obtained on the bus.

In addition, the number of memories can be increased by increasing the number of memory modules each having such a switching configuration. In this case, since each memory module 102 is connected to the memory controller 101 via a corresponding bus 106, there is no difficulty in achieving a higher transmission speed.

Figure 2:
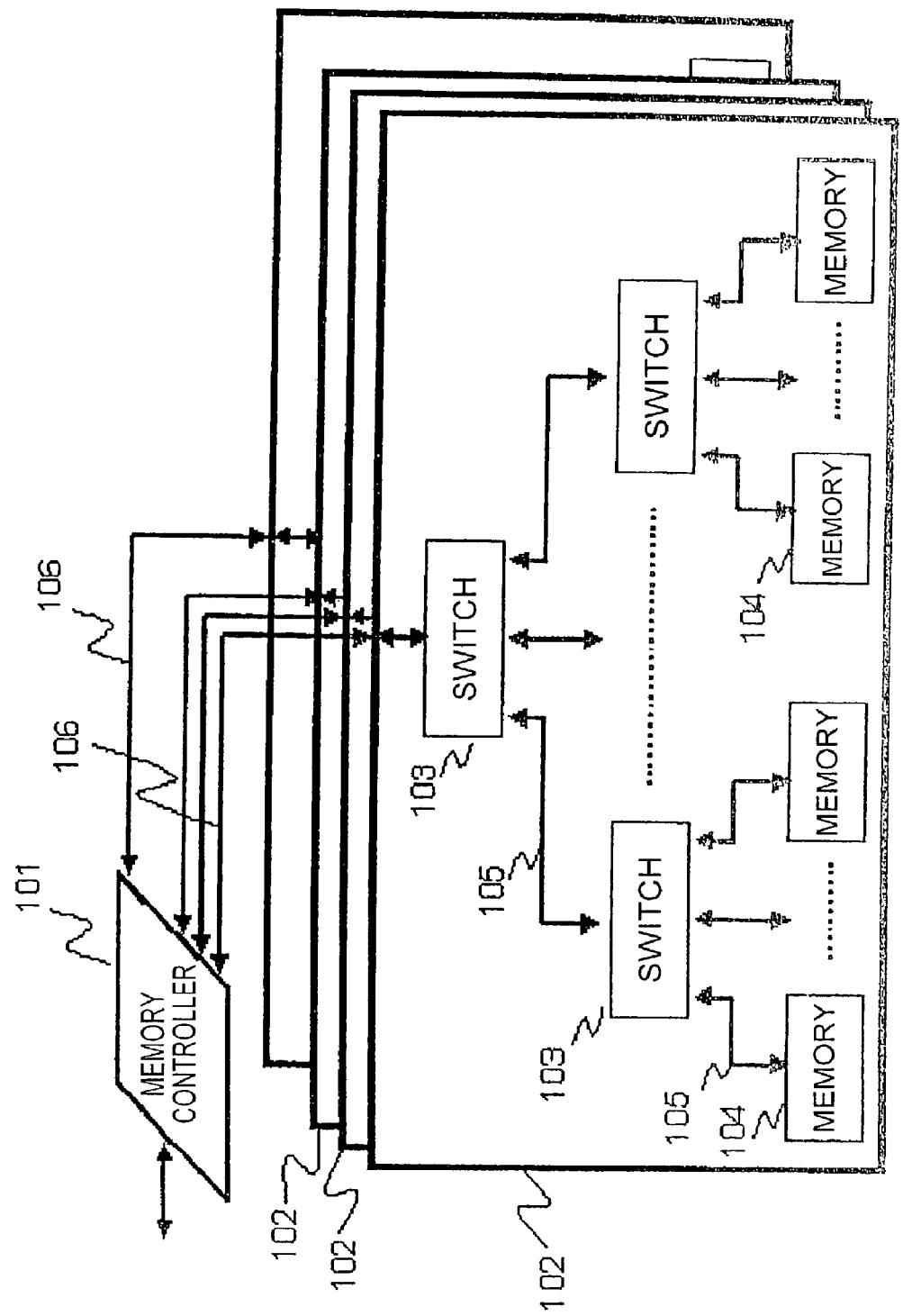
FIG. 2 is a schematic perspective view showing an example of modifications of the memory system of FIG. 1.

FIG. 2 shows an example of modifications of the memory system of FIG. 1, wherein the configuration in the memory module is modified. In FIG. 2, constituent elements same as or similar to those in FIG. 1 are designated by the same reference numerals while omitting a duplicated description.

In the memory module 102 of FIG. 2, it is shown that switches 103 are connected in a hierarchical order to increase the number of memories, wherein switches 103 are connected in two hierarchical ranks. In this case either, since the memories 104 are connected to the memory controller 101 via two switches 103 also in a one-to-one connection, a larger number of memories does not increase the reflection on the transmission line as well as the loads to thereby achieve a higher transmission speed on the bus.

Figure 3:
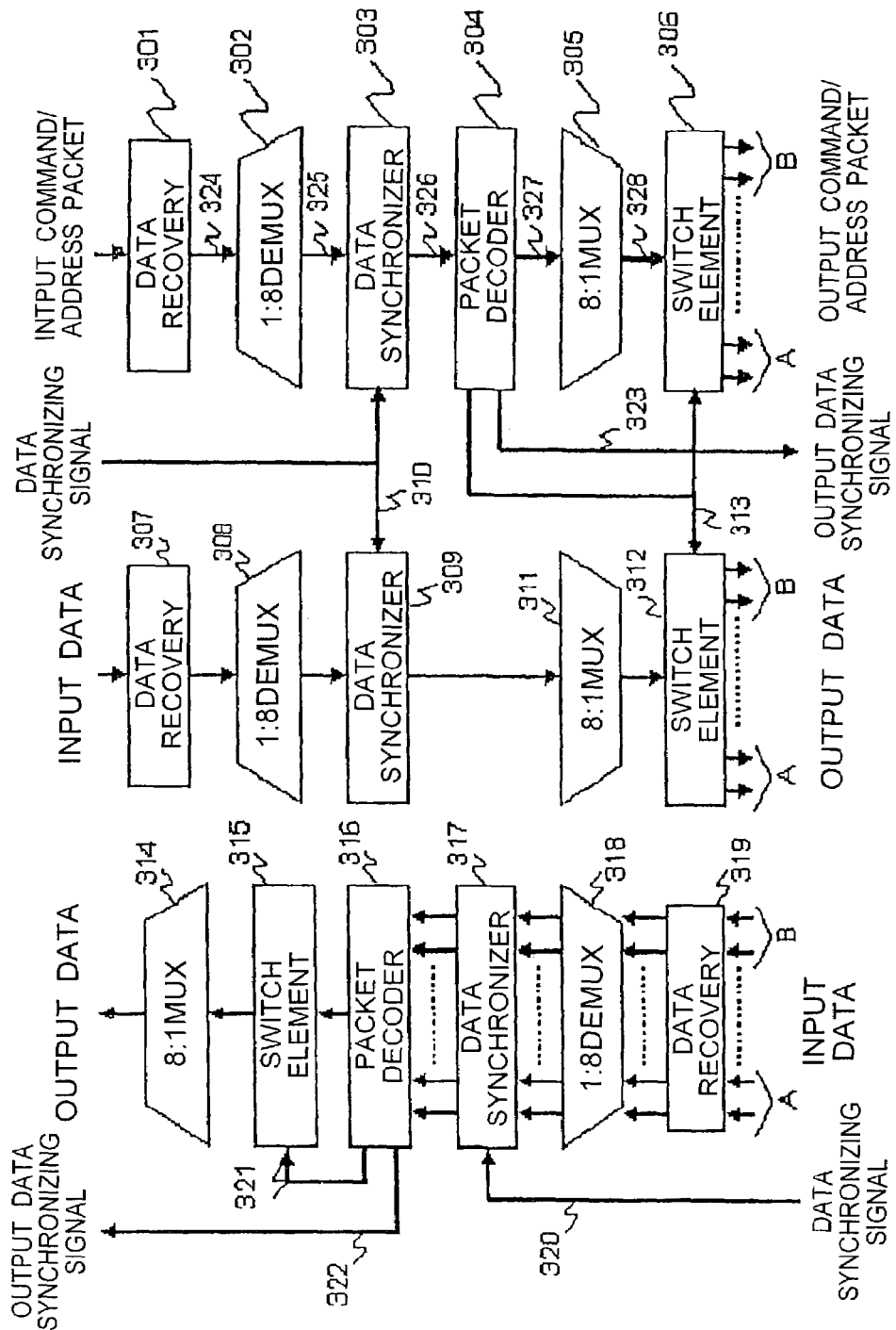
FIG. 3 is a block diagram showing the switch in the memory system of FIG. 1.

FIG. 3 is a block diagram of a star-connection-type switch as an example of the switch 103 shown in FIGS. 1 and 2.

The signal flow from the memory controller via the bus to the memories is effected by 301 to 313 in FIG. 3, whereas the signal flow from the memories via the bus to the memory controller is effected by 314 to 319.

The signal flow from the memory controller to the memories is first described. A command/address packet is fetched in the chip by the data recovery circuit 301. The packet recovered is subjected to a serial-parallel conversion in the serial-parallel converter 302 (such as a 1:8 demultiplexer for the case of 8-bit data).

It is to be noted that the number of bits subjected to the parallel conversion differs depending on the specification, similarly to the case of the memory chip described later, and it may happen that the data is not subjected to such a parallel conversion. There is a possibility that the parallel signals have different phases therebetween due to a difference in the length of the signal transmission medium outside the chip or a difference in the state of the internal clock of the serial-parallel conversion circuit 302.

Thus, the data synchronizer circuit 303 aligns the phases of the parallel signals while using a data synchronizing signal 310 input from outside. The command and address packet thus aligned in the phase is decoded by a packet decoder circuit 304, which outputs the command and address packet thus parallel-converted as well as the decoded results 313. The parallel-converted command and address packet is then subjected to a parallel-serial conversion in a parallel-serial converter circuit (such as an 8:1 multiplexer for the case of 8-bit data) 305. It is to be noted that the number of parallel bits serially converted is equal to the number of bits parallel-converted in the serial-parallel converter circuit 302.

Accordingly, there may be a case wherein the number of parallel bits may be 10 or 16 instead of 8, and a case wherein the parallel-serial converter circuit 305 is not used. For the serially-converted packet, it is determined to which memory or next-stage switch the command/address signals are to be transmitted by the switch element 306, such as having a CMOS configuration, based on the decoded results 313 output from the packet decoder circuit 304. For example, it is determined that signal A is transmitted to the memory A whereas signal B is not transmitted to the memory B, or conversely, that signal A is not transmitted to the memory A whereas signal B is transmitted to the memory B.

The data from the memory controller is first fetched in the chip by a data recovery circuit 307. The recovered data is subjected to a parallel conversion in a serial-parallel converter 308. It is to be noted that there is a possibility that the number of parallel-converted bits is not limited to 8 and the serial-parallel converter 308 is not used here, similarly to the case of the command and address packet.

Since there is also a possibility that the data have phase differences therebetween, similarly to the command and address packet, a data synchronizer circuit 309 aligns the phases while using the data synchronizing signal 310. The parallel-converted data thus aligned in phase is then serially converted by a parallel-serial converter 311 in number corresponding to the number of parallel bits into which the serial-parallel converter 311 converted the data.

For the serially-converted data, it is determined to which memory or next-stage switch the data are to be transmitted by a switch element 312, such as having a CMOS configuration, based on the packet-decoded results 313, similarly to the command and address packet. For example, it is determined that data A is transmitted to the memory A whereas data B is not transmitted to the memory B, or conversely, that data A is not transmitted to the memory A whereas data B is transmitted to the memory B.

For the data flow in the direction from the memories to the memory controller, a data recovery circuit 319 first fetches the data from inside the memory chips A and B. The recovered data are parallel-converted in a serial-parallel converter 318. It is to be noted that the number of parallel-converted bits is not limited to 8 and that the serial-parallel converter 318 is not used herein.

Since there is a possibility that the data from the memory have phase difference therebetween, similarly to the data from the memory controller, the parallel-converted data are aligned in phase by a data synchronizer circuit 317 using a data synchronizing signal 320. For the data thus aligned in phase, it is selected by a switch element 315, such as having a CMOS configuration, from which memory or switch the data is to be transmitted to the memory controller, based on the control signal 321 from a packet decoder circuit 316. For example, it is selected that data A from the memory A is delivered whereas data B from the memory B is not delivered, or conversely, that data A from the memory A is not delivered whereas data B from the data B is delivered.

The selected data is serially converted in a parallel-serial converter circuit 314 and output therefrom. It is to be noted that the number of parallel data bits thus serially converted is equal to the number of the bits parallel-converted in the serial-parallel converter circuit 318.

Figure 4:
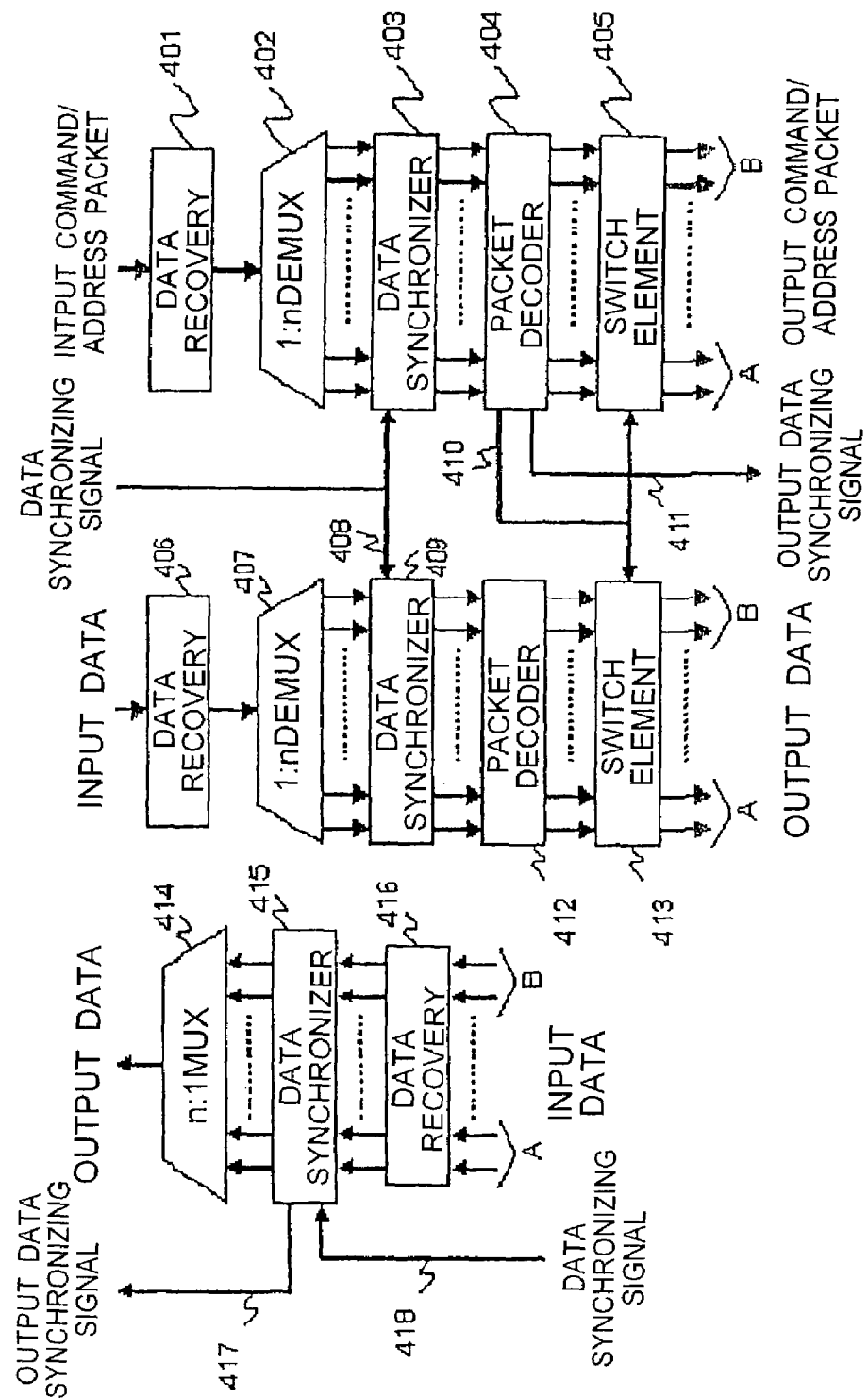
FIG. 4 is a block diagram showing another example of the switch in the memory system of FIG. 1.

FIG. 4 shows a multiplexer/demultiplexer type switch as another example of the switch 103.

The signal flow in the direction from the memory controller to the memories via the bus is effected by 401 to 413 in FIG. 4. On the other hand, the signal flow in the direction from the memory to the memory controller via the bus is shown by 414 to 418.

The signal flow in the direction from the memory controller to the memories is first described. The command and address packet is fetched in the chip by a data recovery circuit 401. The recovered packet is parallel-converted by using a serial-parallel converter circuit (for example, 1:n demultiplexer for the case of n bits) 402.

It is to be noted that the number of parallel-converted bits differs depending on the specification, similarly to the case of the memory chip described later, and there is a possibility that parallel conversion is not used herein. The parallel signals may have phase difference therebetween due to a difference in the length of the signal transmission medium outside the chip or a difference in the state of the internal clock of the parallel-serial converter circuit 402.

Thus, a data synchronizer circuit 403 aligns the parallel signals in phase while using a data synchronizing signal 408 input from outside. The command and address packet thus aligned in phase is decoded by a packet decoder circuit 404, which outputs the parallel-converted command and address packet and the decoded results 410. Based on the signal of the decoded results 410, it is determined by controlling a switch element 405, such as having a CMOS configuration, to which memory or next-stage switch, which data are to be transmitted. For example, it is determined that signal A is transmitted to the memory A whereas signal B is transmitted to the memory B, or conversely, that signal A is transmitted to the memory B whereas signal B is transmitted to the memory A.

The data from the memory controller is first fetched in the chip by a data recovery circuit 406. The recovered data are parallel-converted in a serial-parallel converter circuit 407. It is to be noted that the number of parallel-converted bits is not limited to 8 and that there is a possibility that the serial-parallel converter circuit 407 is not used, similarly to the command and address packet.

Since the data may also have phase difference therebetween, similarly to the command and address packet, a data synchronizer circuit 409 aligns the phase while using a data synchronizing signal 408. For the parallel-converted data thus aligned in phase, it is determined by a switch element 413, such as having a CMOS configuration, to which memory or next-stage switch, which data are to be transmitted based on the packet decoded results in the packet decoder circuit 412, similarly to the command and address packet. For example, it is determined that data A is transmitted to the memory A whereas data B is transmitted to the memory B, or conversely, that data A is transmitted to the memory B whereas data B is transmitted to the memory A.

For the data flow in the direction from the memories to the memory controller, the data are fetched from inside the memory chips A and B by the data recovery circuit 16. Since there is a possibility that the recovered data also have phase difference therebetween, similarly to the data from the memory controller, a data synchronizer circuit 415 aligns the phase while using a data synchronizing signal 418. For the data thus aligned in phase, it is determined by a parallel-serial converter circuit 414 from which memory or switch and in which order the data are to be transmitted to the memory controller.

By providing the data recovery circuit, demultiplexer and data synchronizer circuit on the input side of the switch shown in FIGS. 3 and 4, as described above, the phases are aligned for the inputs (outputs from the memory) having phase differences therebetween, whereby a higher-speed operation can be obtained while suppressing the malfunction caused by the data skews.

Figure 5:
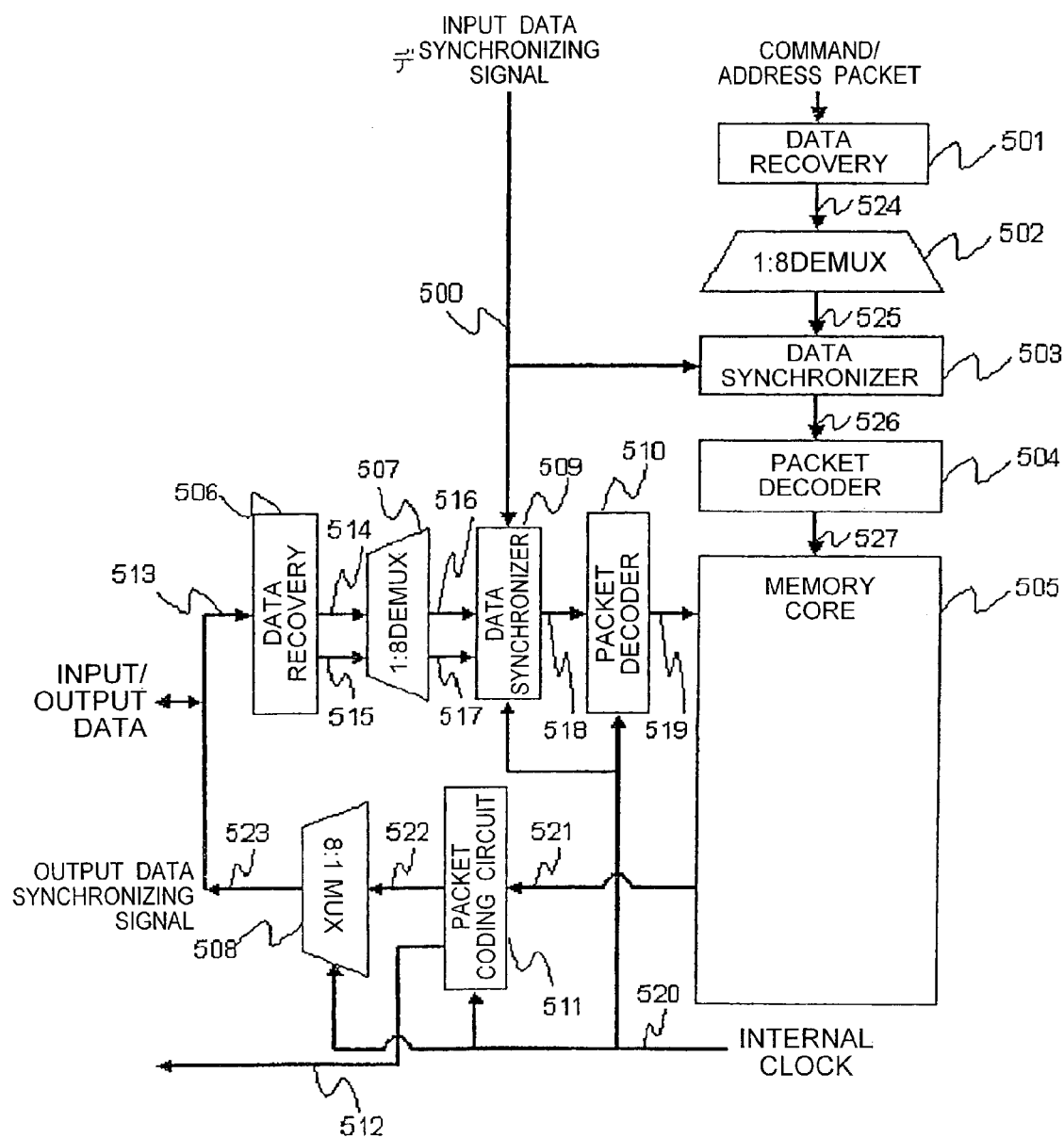
FIG. 5 is a block diagram showing the configuration of the memory chip in the memory system of FIG. 1.

FIG. 5 shows an example of the memory chip 104 shown in FIGS. 1 and 2.

The command and address packet fed from the memory controller or switch is first input to the internal of the chip by using a data recovery circuit 501. The recovered command and address packet output from the data recovery circuit 501 is converted into parallel data by a serial-parallel converter circuit 502. It is to be noted that a 1:8 serial-parallel converter circuit (1:8 demultiplexer) 502 which converts the data into 8-bit data is exemplarily used herein.

There is a possibility that the number of bits of the parallel data differs depending on the specification for the command and address packet, and thus it may be 10 or 16. In addition, depending on the specification for the packet, it may arise that the serial-parallel converter circuit 502 is not used. The phases of the command and address packet thus parallel-converted may differ depending on a difference in the length of the transmission medium between the switch and the memory, or the state of the clock of the serial-parallel converter circuit 502. Thus, the phases of the parallel-converted command and address packet are aligned by a data synchronizer circuit 503 while using a data synchronizing signal 500 input from outside.

The command and address packet thus aligned in phase is decoded for the command and address by a packet decoder circuit (decoder) 504, and delivered to the memory core having a plurality of memory cells arranged in a matrix.

On the other hand, the input data 513 is fetched in the chip by a data recovery circuit 506, and then parallel-converted in the serial-parallel converter circuit 507. It is to be noted that the number of parallel bits depends on the specification. Although 8-bit is exemplified herein, the number of bits may be 10 or 16. Or, there may be a case wherein the serial-parallel converter circuit 507 is not used. The parallel-converted data are aligned in phase by a data synchronizer circuit 509. The data synchronizer circuit 509 aligns the phases of the data while using a data synchronizing signal 500, as in the case of the data synchronizer circuit 503 for the command and address packet. The data thus aligned in the phases thereof are decoded by a packet decoder circuit 510 to be input to the memory core 505. It is to be noted that there is a possibility that the packet decoder circuit 510 is not used depending on the specification for the data.

The output data are serially decoded by a parallel-serial converter circuit 508 from 8-bit parallel data, for example, and output from the memory core 505. There may be a case wherein the number of bits from which the parallel data are converted depends on the specification for the data, and thus may be 10 or 16, or else the data are output without a serial conversion. In addition, depending on the specification for the data, a packet decoder circuit 511 may be used between the memory core 505 and the parallel-serial converter circuit 508.

Figure 6:
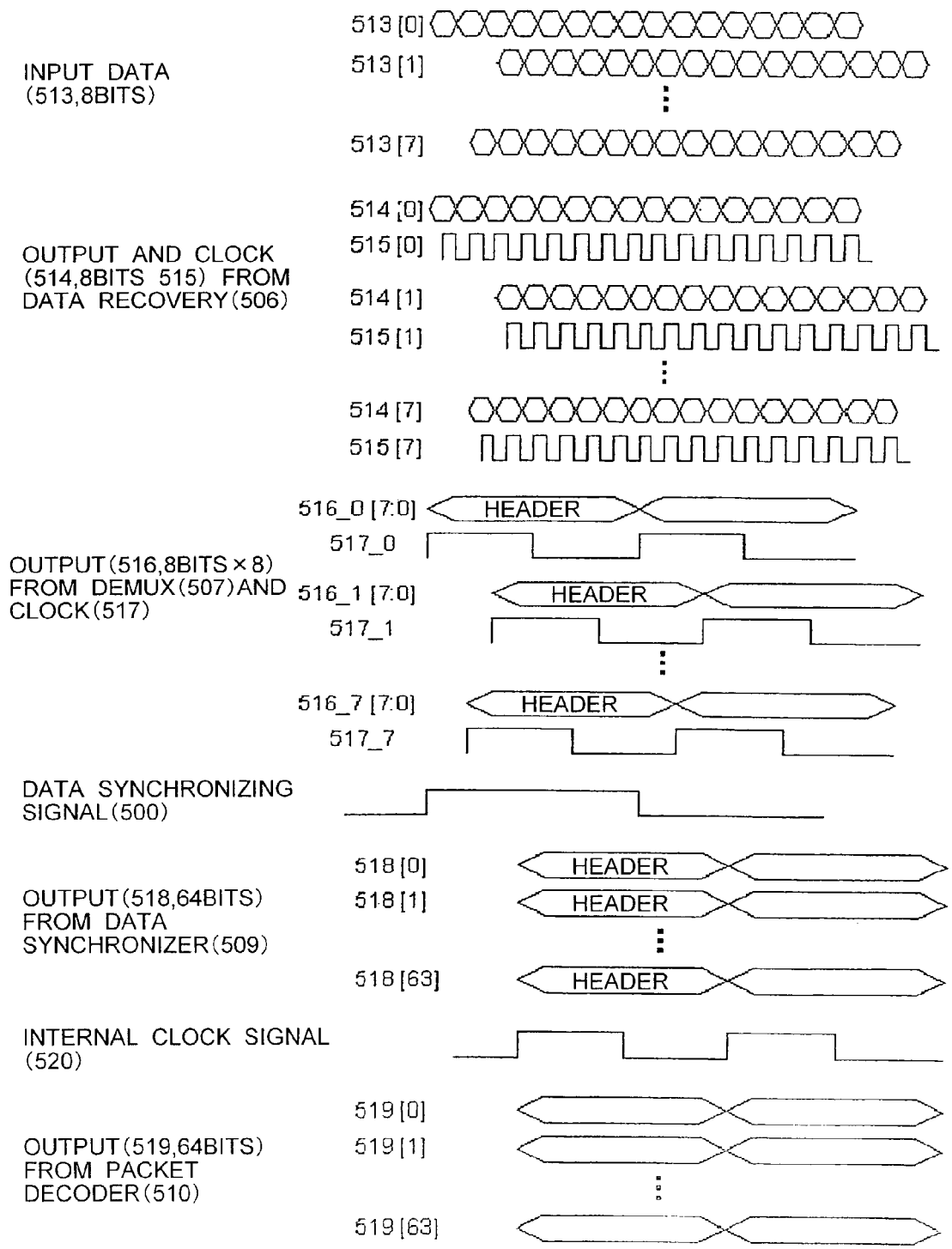
FIG. 6 is a timing chart of the input data in the memory chip of FIG. 5.
Figure 7:
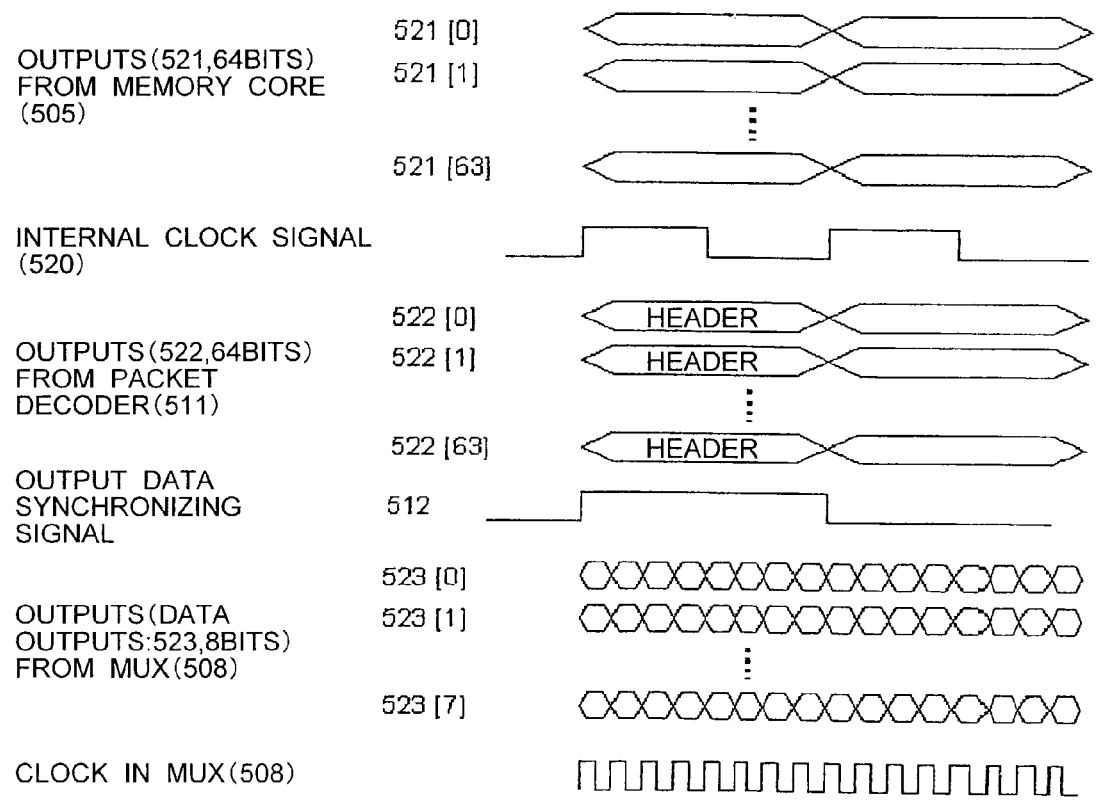
FIG. 7 is a timing chart of the output data in the memory chip of FIG. 5.
Figure 8:
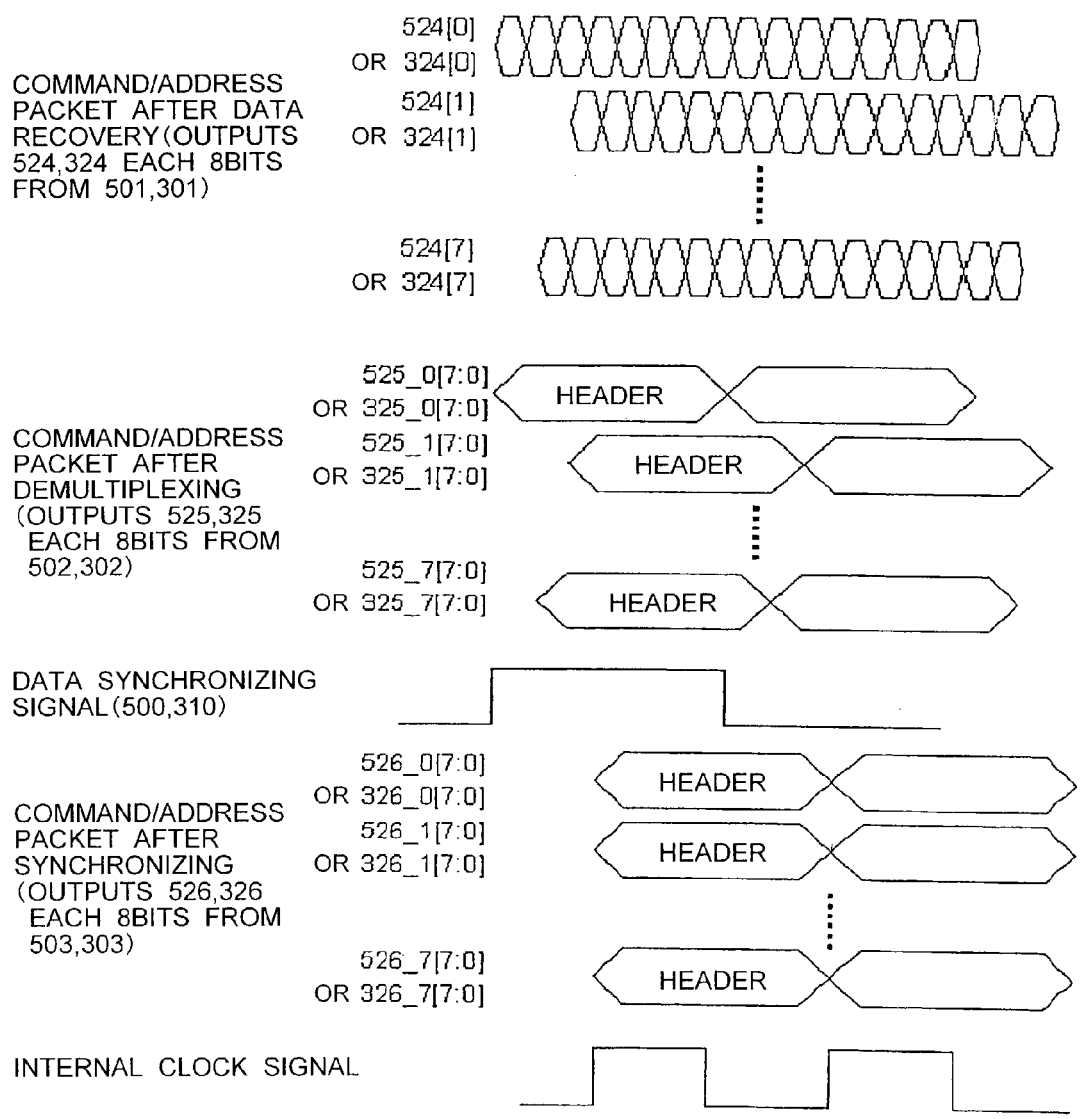
FIG. 8 is a timing chart of the command/address packet at respective positions of FIG. 3 and FIG. 5.

FIG. 6 is a timing chart of the input data at respective locations of the memory chip of FIG. 5. FIG. 7 is a timing chart of the output data at the respective locations of the memory chip of FIG. 5. FIG. 8 is a timing chart of the command/address at the respective locations in FIG. 5.

Description will given for the timing charts of FIGS. 6 and 7 for the input and output data in the memory chip. It is to be noted that the case of 8 bits is exemplified for the bit width of the input and output data.

As to input data (FIG. 6):

Input data 513[0] to 513[7] may have data skews therebetween caused by a difference in the length of the data transmission line between the memory controller and the memory chip. A plurality of input data having data skews therebetween are fetched in the memory chip by the data recovery circuit 506 at the clocks having optimum timings for the respective data, and delivered to the 1:8 demultiplexer 507 as data 514. Subsequently, the data skews are transferred to the outputs from the 1:8 demultiplexer 507 and the clock 517. Then, for removing the data skews, the outputs 516 from the 1:8 demultiplexer 507 are synchronized with the internal clock 520 of the memory chip by the data synchronizer circuit 509 using the data synchronizing signal 500. Thereafter, the input data are decoded by the packet decoder circuit 510 and input to the memory core 505 as data 519.

As to output data (FIG. 7):

The data 521 from the data core 505 are synchronized with the internal clock 520. The data are coded by the packet coding circuit 511 to obtain data 522, and the data synchronizing signal 512 is generated in synchrony with the header of the packet. Subsequently, the coded data 522 are input to the 8:1 multiplexer 508, serially converted by using a high-speed clock inside the multiplexer and delivered as data 523.

Description will be now given with reference to FIG. 8 showing a timing chart of the command/address packet in the memory chip or the switch chip. It is to be noted that the case of 8 bits is exemplified for the bit width of the command/address packet.

The input command/address packet may have data skews therein due to a difference in the length of the data transmission line between the memory controller and the switch chip or between the switch chip and the memory chip. A plurality of input command/address packets each having therein data skews are fetched in the chip by the data recovery circuits 501 and 301 at the clocks having optimum timings for the respective command/address packets, and delivered to the demultiplexers 502 and 302 as data 524 and 324. The data skews are transferred to the outputs from the 1:8 demultiplexers 525 and 325. Thereafter, for removing the data skews, the outputs 525 and 325 from the demultiplexers 502 and 302 are synchronized with the clock 520 inside the respective chips by the data synchronizer circuits 503 and 303 while using the data synchronizing signals 500 and 310.

Figure 9:
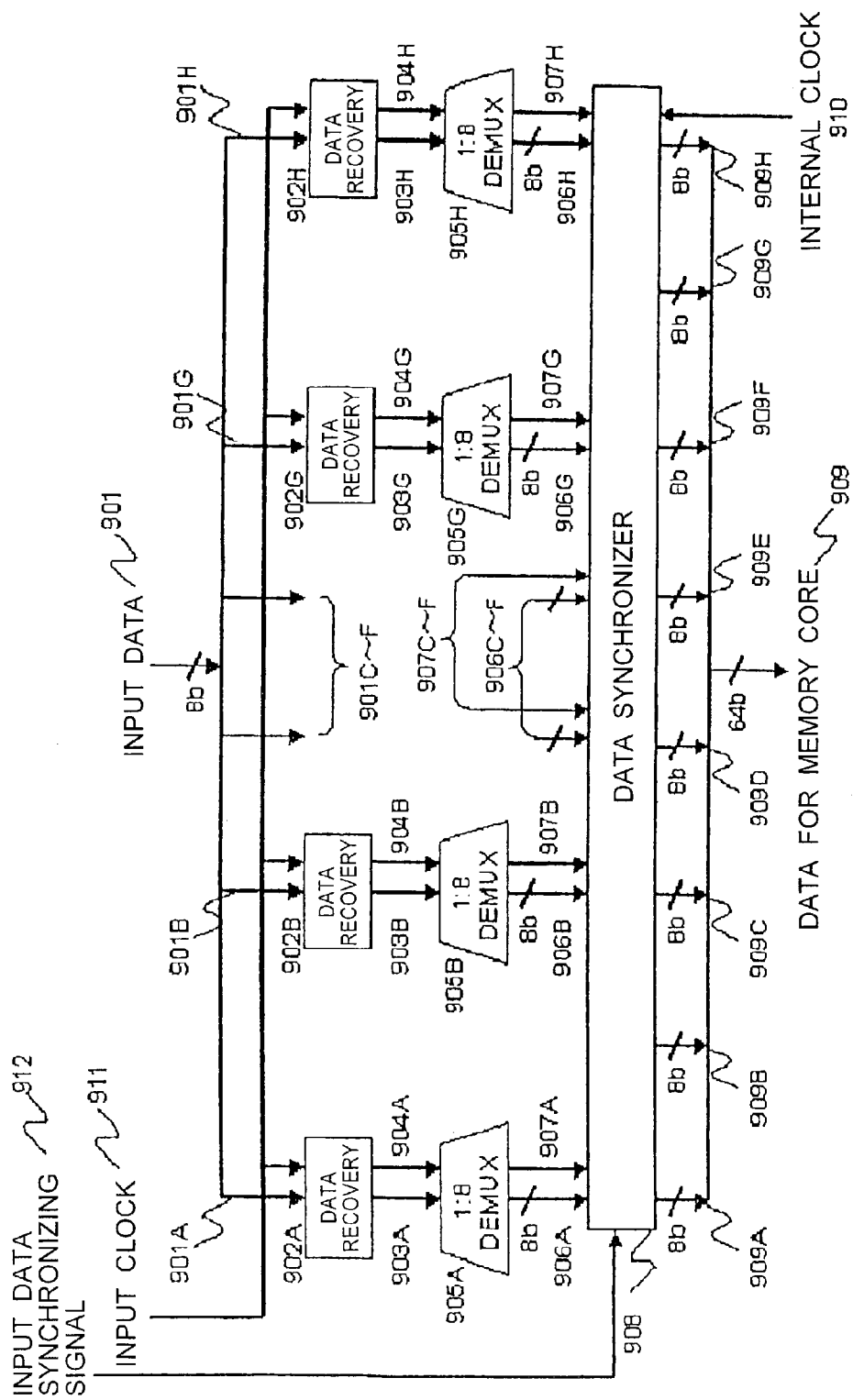
FIG. 9 is a block diagram showing the fetch of the input data by the memory system of FIG. 1.
Figure 10:
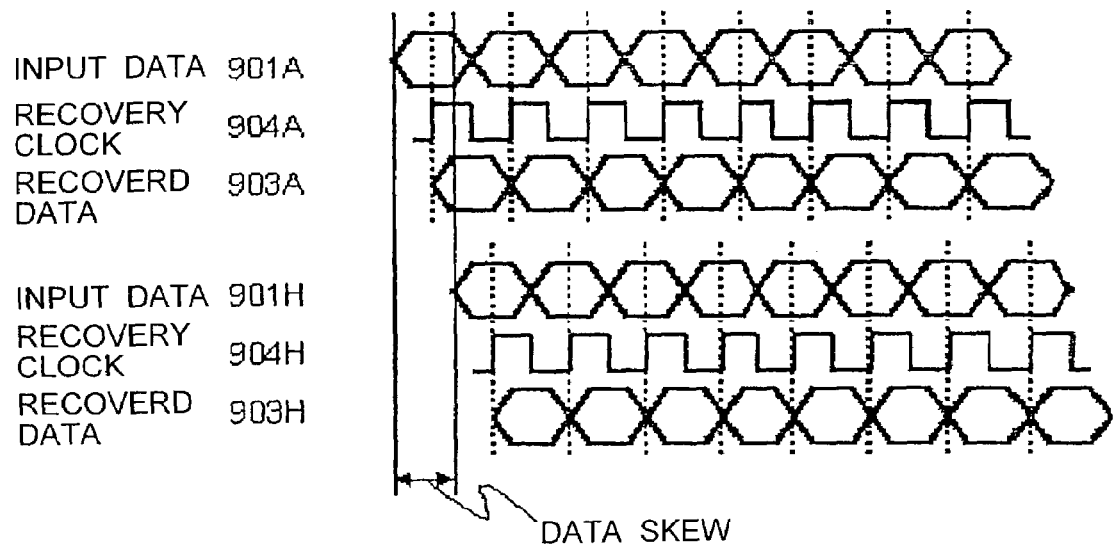
FIG. 10 is a timing chart showing the signals on respective positions in FIG. 9.

FIG. 9 is a block diagram in connection with the fetch of the input data in the memory chip, and FIG. 10 is a timing chart thereof.

Figure 20:
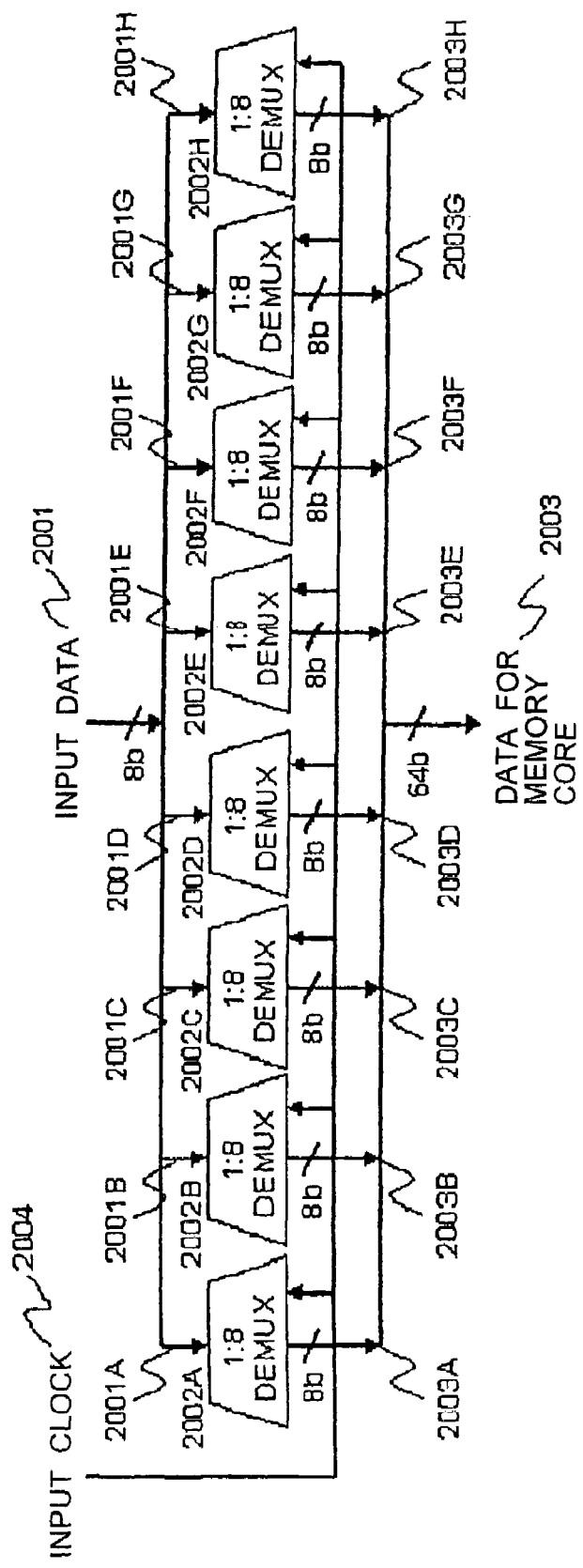
FIG. 20 is a block diagram showing the fetch of the input data by the memory chip of FIG. 19.
Figure 21:
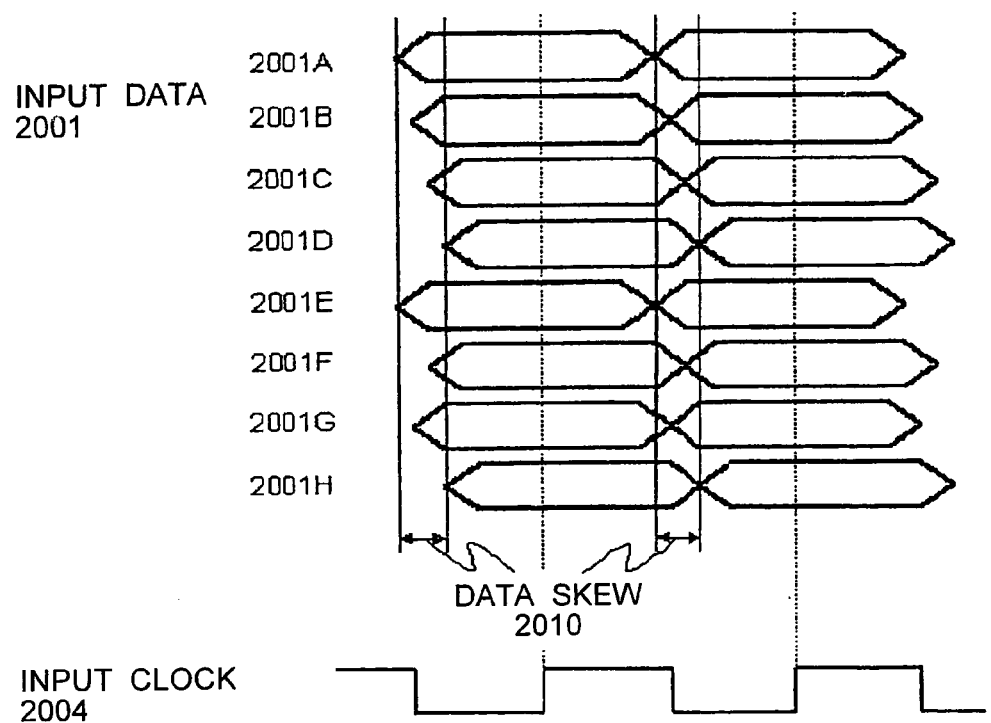
FIG. 21 is a timing chart of respective positions shown in FIG. 20.

The memory chip in the present invention solves the problem of malfunction in the fetch of the data caused by the data skews in the conventional technique as described with reference to FIGS. 20 and 21, thereby allowing the data rate to be raised, i.e., allowing the data transmission speed to be increased.

In the present invention, as shown in FIG. 9, all of the input 8-bit data 901A to 901H are input to the data recovery circuits 902A to 902H, respectively. The data recovery circuits 902 fetch the data fed to the data recovery circuits at the optimum timings of the data. Accordingly, a plurality of data input to the memory chip can be fetched by the chip even in the case of the data involving data skews therebetween.

The data fetched in the chip by the data recovery circuit have respective different phases. More specifically, data 903A to 903H are delivered by using clocks 904A to 904H having optimum timings for the respective input data.

These data 903 and clocks 904 are input to eight 1:8 demultiplexers 905A to 905H, respectively. The 1:8 demultiplexers operate in accordance with the input clocks, that is, the eight 1:8 demultiplexers operate in synchrony with the clocks having independent phases.

Therefore, the phases of the output data 906A to 906H from the eight 1:8 demultiplexers 905A to 905H are independent among the eight demultiplexers. Thus, in order to align these data having different phases to have a single phase, the output 906 from the demultiplexer is input to the data synchronizer circuit 908, thereby synchronizing the outputs 906A to 906H with each other to be output as the output data 909.

As described above, in the memory chip of the present invention, a data recovery circuit is provided for each bit of the input data, wherein each data is fetched in the chip at the optimum timing of the each data. Accordingly, the problem of the data skew constituting a limiting factor for the data transmission speed in the conventional memory chip can be solved, and the memory chip of the present invention is capable of transmitting data higher than the conventional memory chip.

In the memory chip of the present invention, it can be considered that the data recovery circuit 902 which is connected to the bus for suppressing the adverse affects by the data skews caused by the difference in the transmission line and the 1:8 demultiplexer 905 and the data synchronizer circuit 908 which are connected to the data recovery circuit constitute a part of a memory interface.

Figure 11:
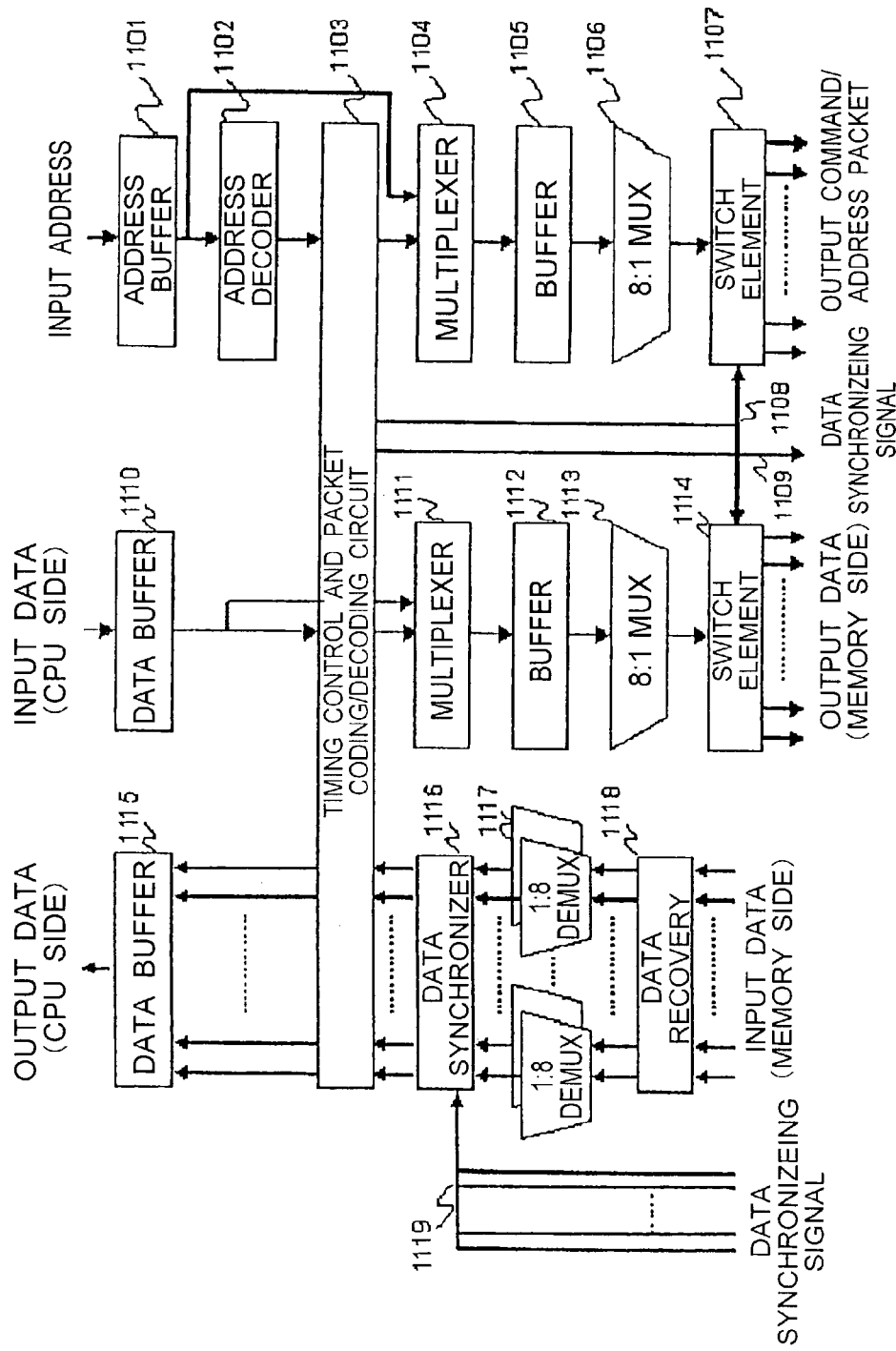
FIG. 11 is a block diagram of the memory controller in the memory system of FIG. 1.
Figure 12:
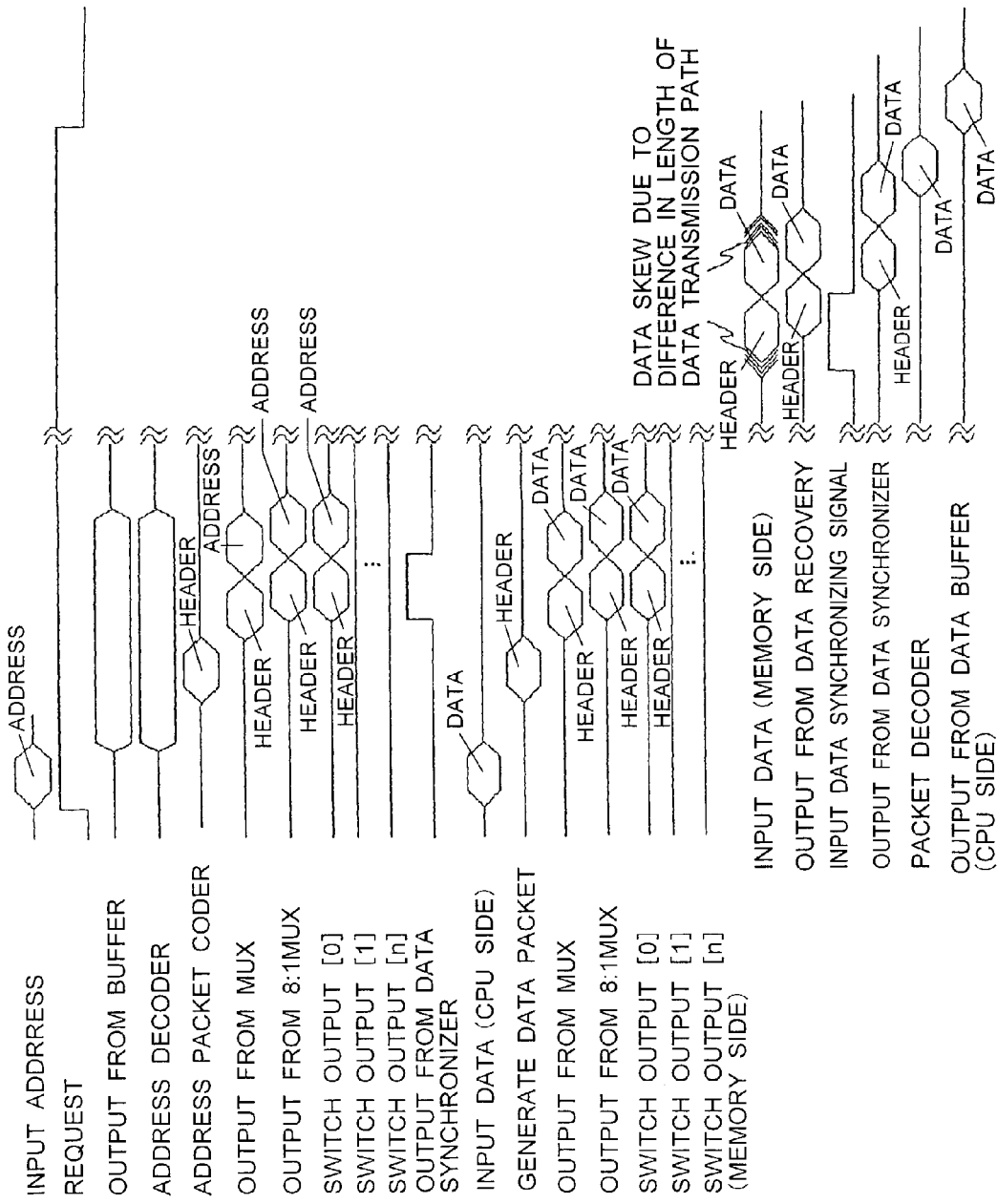
FIG. 12 is a timing chart of the memory controller of FIG. 11.

FIG. 11 is a block diagram exemplifying a memory controller according to an embodiment, and FIG. 12 is a timing chart thereof.

An input address is fed to a switch element 1107, such as having a CMOS configuration, through an address buffer 1101, an address decoder circuit 1102, a timing control and packet coding/decoding circuit 1103 a multiplexer 1104, a buffer 1105 and an 8:1 multiplexer 1106, wherein a control signal 1108 from the timing control and packet coding/decoding circuit 1103 operates the switch element 1107 to select and output a command/address packet onto the bus.

In addition, input data is fed to a switch element 1114, such as having a CMOS configuration, through a data buffer 1110, the timing control and packet coding/decoding circuit 1103, a multiplexer 1111, a buffer 1112 and an 8:1 multiplexer 1113, wherein the control signal 1108 from the timing control and packet coding/decoding circuit 1103 operates a switch element 1114 to select data, which is output onto the bus and then delivered to the memory.

On the other hand, the data output from the memory is fetched by a data recovery circuit 1118 through the bus, and output toward the CPU through a 1:8 demultiplexer 1117, a data synchronizer circuit 1116 and the timing control and packet coding/decoding circuit 1103 and a data buffer 1115.

By providing the data recovery circuit, demultiplexer and data synchronizer circuit at the input side (the side receiving the output data from the memory) of the memory controller of FIG. 11, as described above, the phases are aligned even in the case of the input data (output data from the memory) having data skews therebetween, whereby a high-speed operation can be obtained while suppressing the malfunction caused by the data skews.

The data recovery circuit 1118 which is connected to the bus for suppressing the adverse affects by the data skews caused by a difference in the transmission line and the 1:8 demultiplexer 1117 and the data synchronizer circuit 116 which are connected to the data recovery circuit constitute a part of a memory interface.

Figure 13:
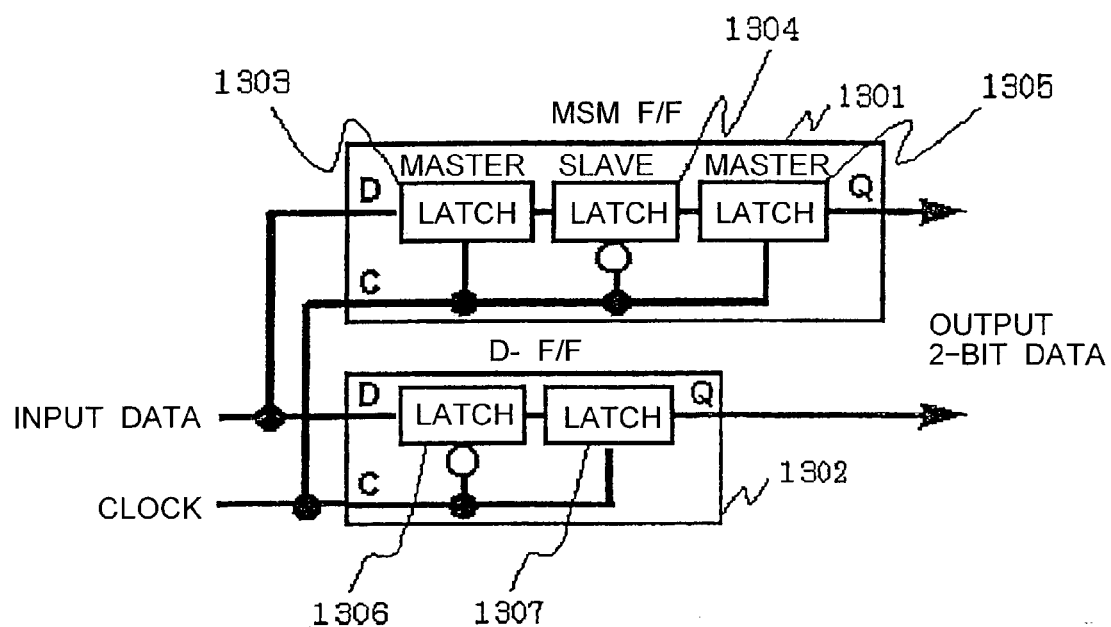
FIG. 13 is a block diagram of a 1:2 serial-parallel conversion circuit.

FIG. 13 shows a block diagram of a 1:2 serial-parallel converter circuit (1:2 demultiplexer), which is constituted by a master-slave flip-flop 1302 including latches 1306 and 1307 and another master-slave flip-flop 1301 including latches 1303 to 1305, and has a function for parallel conversion of data into two data at a rising edge and a falling edge of an input clock having a speed half the speed of the input data.

Figure 14:
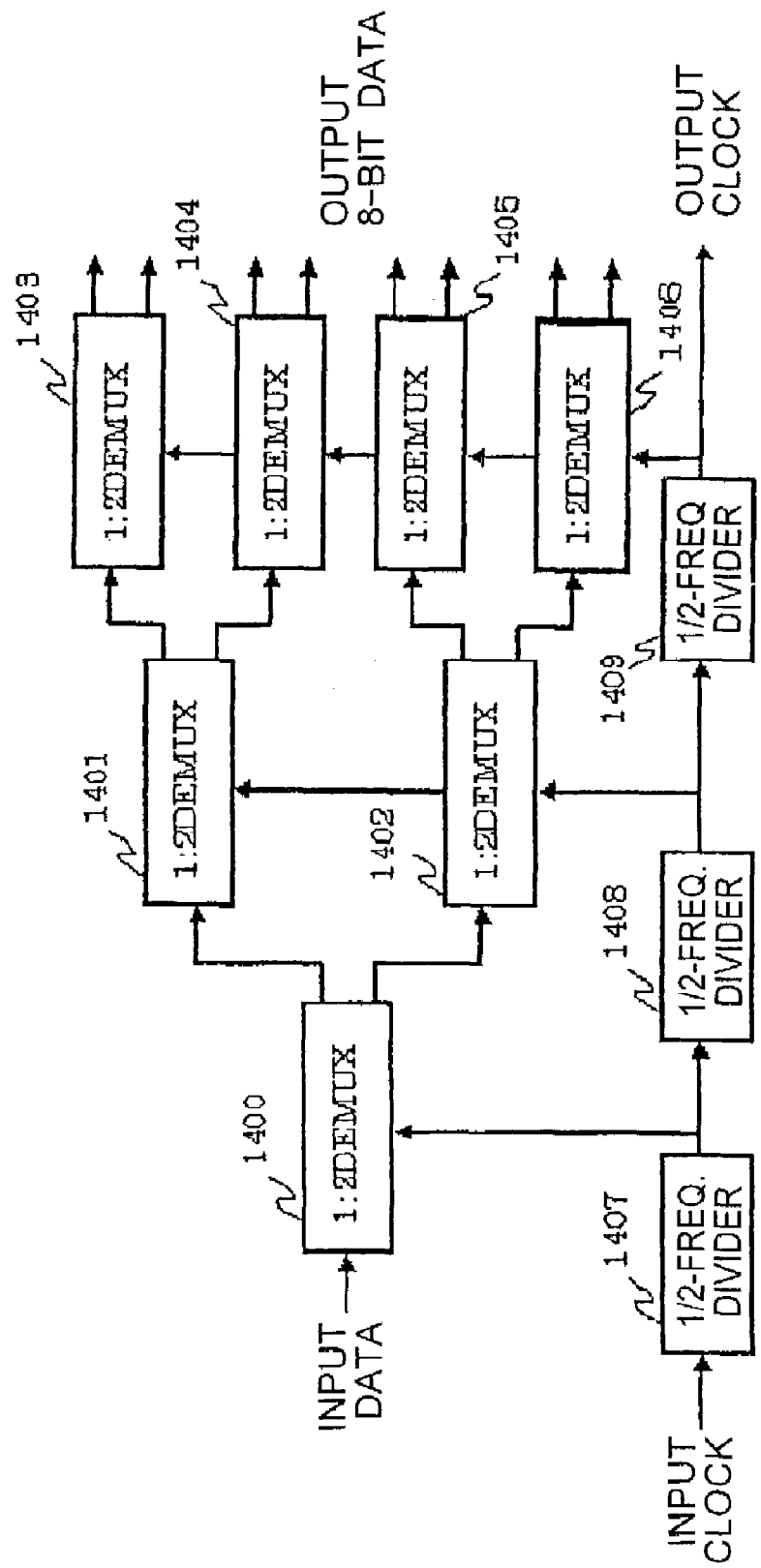
FIG. 14 is a block diagram of the 1:8 serial-parallel conversion circuit.

FIG. 14 shows a block diagram of the 1:8 serial-parallel converter circuit. The 1:8 serial-parallel converter circuit is obtained by connecting the 1:2 serial-parallel converter circuits 1400 to 1406 in a tree fashion. The clock to be distributed to each stage is generated by using ½-frequency dividers 1407 to 1409.

Figure 15:
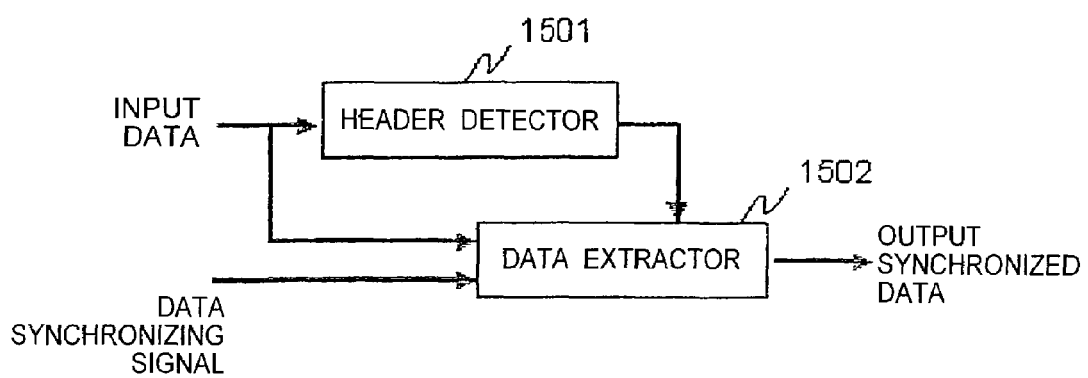
FIG. 15 is a block diagram of the data synchronizer circuit.

FIG. 15 is a circuit diagram showing the data synchronizer circuit. The data synchronizer circuit includes a header detection circuit 1501 and a data extraction circuit 1502, having a configuration wherein synchronization of data is effected by adjusting the timings of the header of the data and the data synchronizing signal input from outside.

Although a data synchronizer circuit which requires external data synchronizing signal is shown herein, the data synchronizing signal may be incorporated in the input data. If such a coded data is used, data synchronization can be obtained without receiving the data synchronizing signal from outside.

Figure 16:
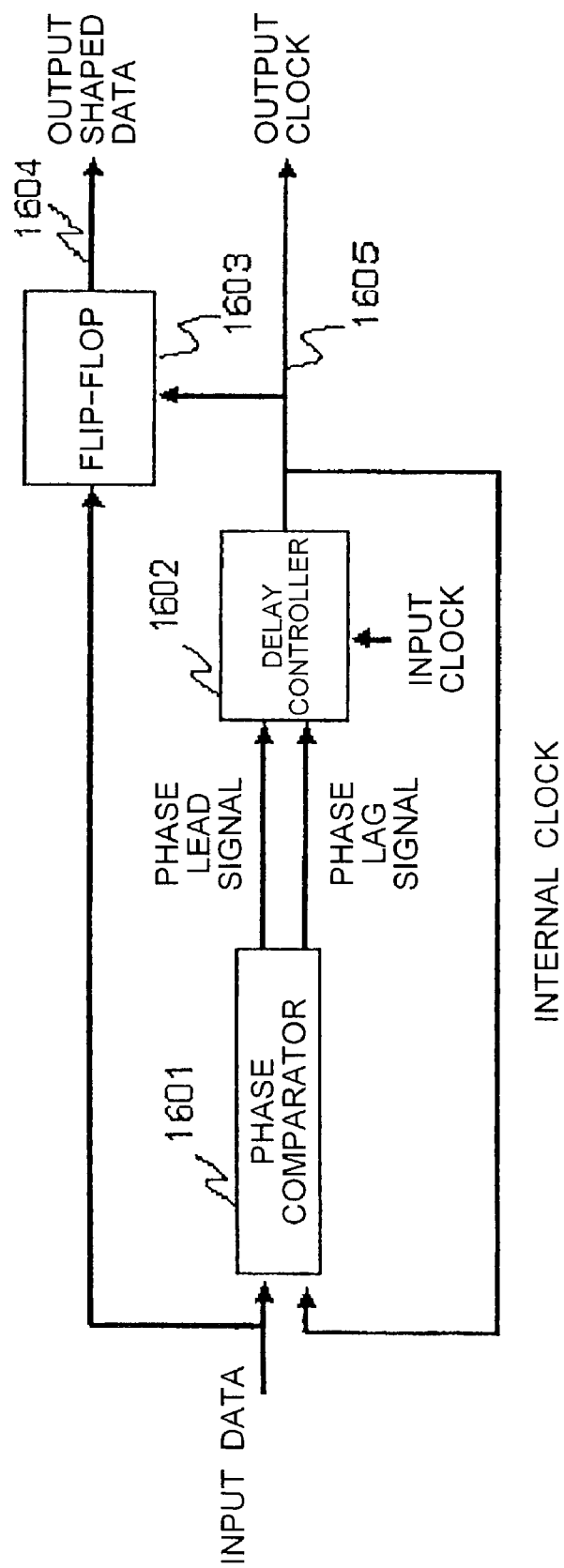
FIG. 16 is a block diagram of the data recovery circuit.

FIG. 16 shows the configuration of the data recovery circuit. The difference between the phase of the input data and the phase of the internal clock is detected by using a phase comparator circuit 1601, whereby one of two signals, phase lead signal and phase lag signal, is delivered depending on the comparison result of the phase comparator circuit 1601 as to whether the data leads or lags from the internal clock. A delay control circuit 1602 changes the phase of the clock depending on the result from the phase comparator circuit 1601, thereby matching the input data with the internal clock in phase. By using the internal clock thus matched in phase, the input data is shaped in the waveform thereof such as by a flip-flop 1603, and output as data 1604. In addition, the internal clock 1605 thus matched in phase is also output.

Figure 17:
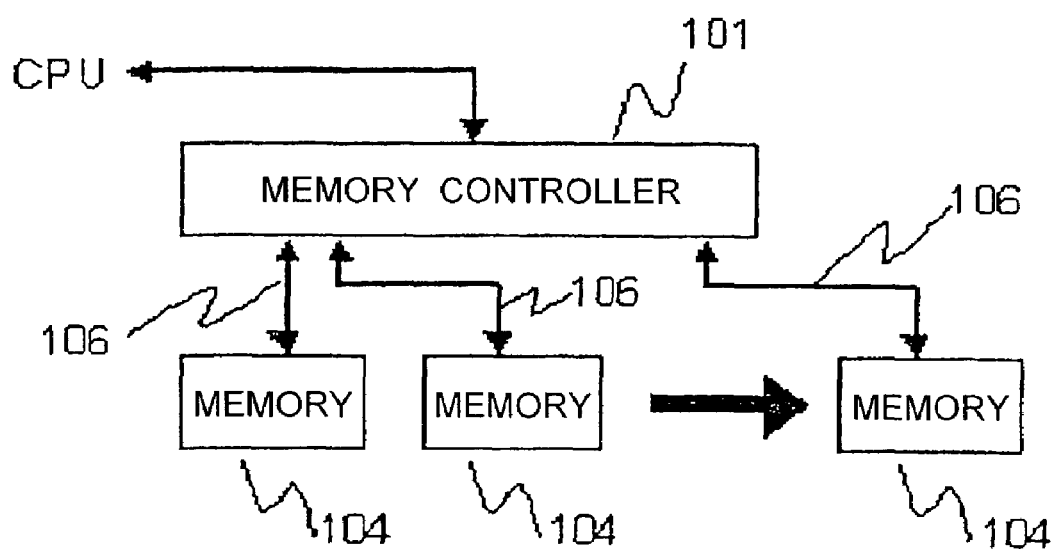
FIG. 17 is a block diagram of a memory system according to another embodiment of the present invention.
Figure 18:
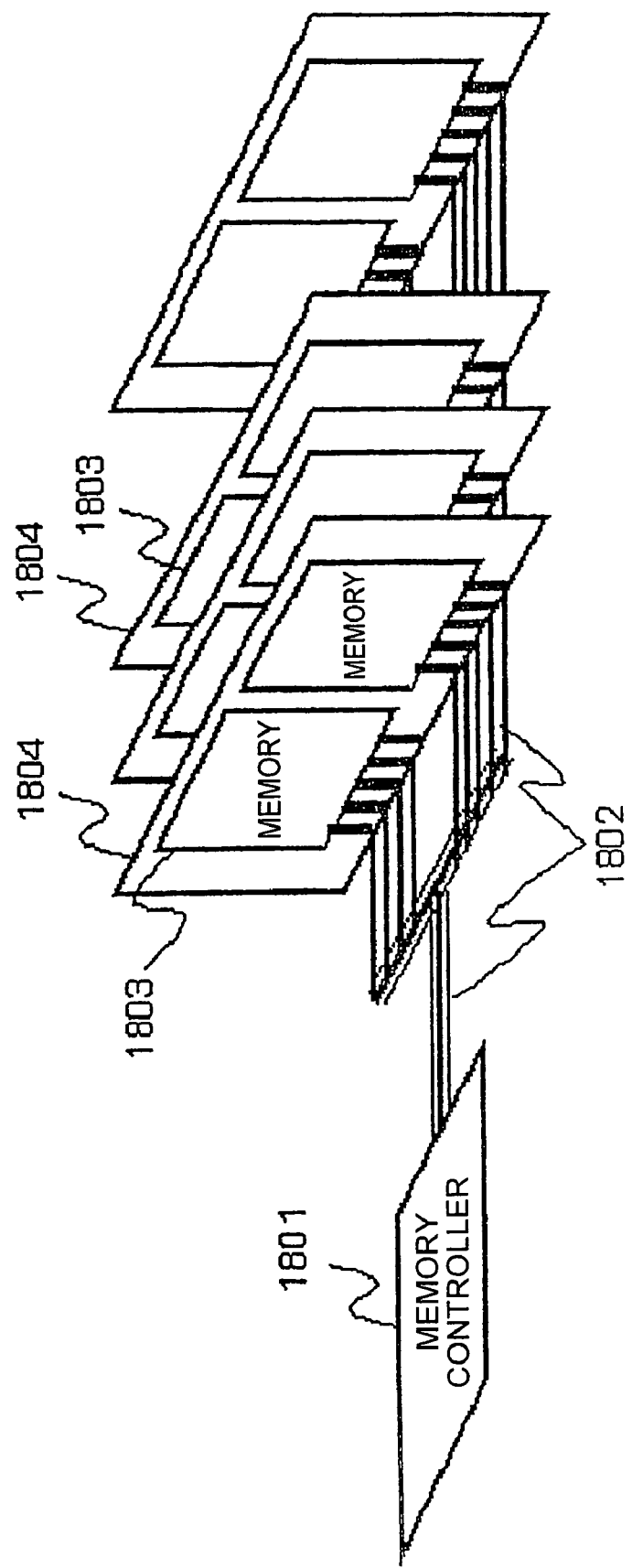
FIG. 18 is a schematic perspective view of a conventional memory system.
Figure 19:
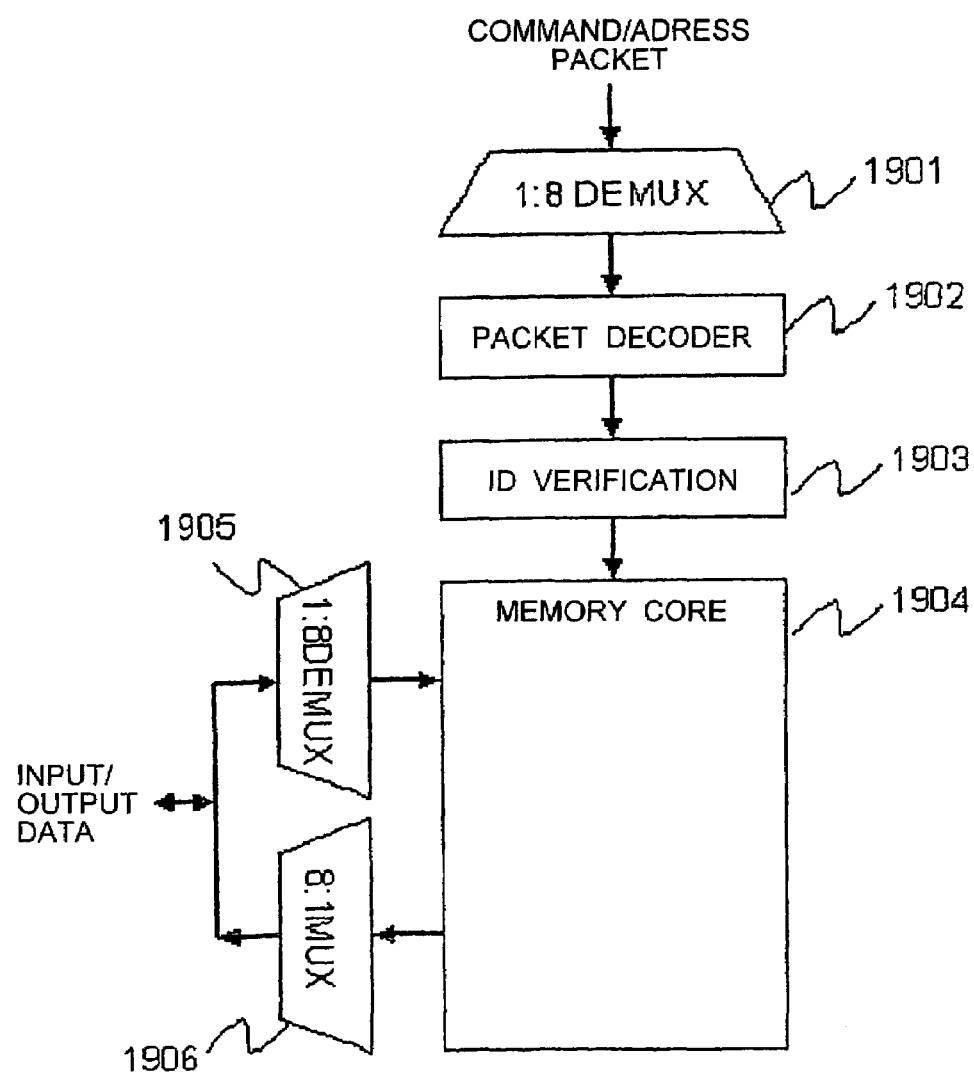
FIG. 19 is a block diagram showing the memory chip in the memory system of FIG. 18.

FIG. 17 shows a memory system according to another embodiment of the present invention. A plurality of memory chips 104 are connected to the memory controller 101 via respective buses 106.

Since the memory chips 104 are connected to the memory controller 101 in one-to-one connection in such a way, even if the number of memories is increased, the reflection on the buses and the loads are not increased, whereby a higher transmission speed can be obtained on the buses.

In addition, as shown in FIG. 5 for the memory chip 104, by providing the data recovery, demultiplexer and data synchronizer circuits on the input side thereof, the phases are aligned even in the case of the data having phase differences therein, whereby the malfunction caused by the data skews can be suppressed to obtain a high-speed operation.

Similarly, by providing the data recovery, demultiplexer and data synchronizer circuits on the side of the memory controller at which the data are input from the memories, the phases are aligned even in the case of the data having phase differences therein, whereby a higher-speed operation can be obtained while suppressing the malfunction caused by the data skews.

In the present invention, if the memory has a small scale, a memory system such as shown in FIG. 17 is suited, wherein memory chips are connected to the memory controller via respective buses.

If the memory has a medium scale, a memory system such as shown in FIG. 1 is suited, wherein memory chips are connected to the memory controller via a switch and a bus.

If the memory has a large scale, a memory system such as shown in FIG. 1 is suited, wherein the memories are connected to the memory controller via a bus and a switch which is constituted by the multiplexers/demultiplexers shown in FIG. 4.

The invention claimed is:

1. A memory chip comprising a memory core including a plurality of memories arranged in a matrix,
    wherein a command/address signal and a data signal are input to said memory core, characterized in that each of said command/address signal and said data signal is input via a data recovery circuit, and
    wherein each of said command/address signal and said data signal is input to said memory core via a data synchronizer circuit and a packet decoder circuit after passing said data recovery circuit.

2. The memory chip according to claim 1, wherein a demultiplexer having a function for serial-parallel conversion is disposed between said data recovery circuit and said data synchronizer circuit.

3. A plurality of memory chips as claimed in claim 1, wherein each of the plurality of memory chips is connected to one of a plurality of switches.

4. The plurality of memory chips as claimed in claim 3, wherein the plurality of memory chips and the plurality of switches are mounted on modules.

5. The plurality of memory chips as claimed in claim 3, wherein each of the plurality of memory chips is connected to one of a plurality of switches connected in a star connection.

6. The plurality of memory chips as claimed in claim 4, wherein each of the plurality of switches is a multiplexer or de-multiplexer.

7. The plurality of memory chips as claimed in claim 4, wherein a plurality of output signals are delivered through the switches at once.

8. The plurality of memory chips as claimed in claim 5, wherein each of the plurality of switches includes a data synchronization circuit.

9. The plurality of memory chips as claimed in claim 6, wherein each of the plurality of switches includes a data synchronization circuit.

* * * * *